May 6 1969 K. M. BUSEN ETAL 3,443,174

L-H JUNCTION LATERAL TRANSISTOR

Filed May 17, 1966

United States Patent Office 3,443,174
Patented May 6, 1969

3,443,174

L-H JUNCTION LATERAL TRANSISTOR

Karl M. Busen, Joseph Lindmayer, William C. Schneider, and Wei K. Tsang, Williamstown, Mass., assignors to Sprague Electric Company, North Adams, Mass., a corporation of Massachusetts Filed May 17, 1966, Ser. No. 550,697
Int. Cl. H01l 11/00
U.S. Cl. 317—235 4 Claims

ABSTRACT OF THE DISCLOSURE

Laterally spaced emitter and collector regions of equal impurity concentration and of one conductivity type extend through a homogeneous layer of low impurity concentration of the opposite conductivity type into engagement with a high impurity concentration region of said opposite conductivity type. The impurity concentration in the high impurity concentration region is greater than the impurity concentration in the emitter and collector regions. The impurity concentration in the low impurity concentration layer is less than the impurity concentration in the emitter and collector regions. By means of this construction the vertical emitter current into the high impurity concentration region is negligible in comparison to the lateral emitter current into the low impurity concentration base layer between the emitter and the collector.

This invention relates to lateral transistors and a method of making these transistors. More particularly this invention relates to parameters which improve the performance of a lateral transistor.

PNP planar transistors of the prior art that are formed so as to permit connections from a major surface present a problem of conductivity inversion at the surface when certain easily available materials are used. Lateral transistors formed in a surface of a monolithic body to permit connections to the transistor at a major surface of the body are not affected by this inversion problem. Lateral transistors are designated as the transistor structure having the emitter-base and collector-base junctions formed in a major surface of an opposite conductivity-type body and flanking each other. The important electronic current between these junctions flows laterally from the emitter across an interposed part of opposite conductivity type to an elongated section of the collector junction. The intervening semiconductor body forms the base of the lateral transistor. There is also a current flowing out of the emitter into the base away from collector and into the bulk region of the base.

In the fabrication of a lateral transistor the emitter and collector junctions are formed by introducing a suitable impurity into the opposite conductivity-type body at the major surface. The impurity diffusion forms a small emitter region with a larger collector region, so that a section of the collector junction is presented for current flowing laterally from the emitter junction. The impurities forming the collector are extended across the major surface to make the lengthwise dimension the principal dimension of the collector region, so that a substantial section of the collector junction area is presented for the current flowing laterally into the collector junction.

Lateral transistors of the PNP silicon variety have P-type regions which form the emitter and the collector, and the N-type spacing between the sides of these two regions serves as the base. Part of the base region is interposed between the emitter-base and base-collector junctions.

It appears that the principal optimum parameters dictated by present technology cannot be improved substantially, where it is understood that these parameters are current gain and the frequency response. The frequency is limited by back injection and its associated life time, with a result that in practice the cutoff frequency is less than 30 mc./s. It would be desirable to provide a lateral transistor having suitable gain and frequency characteristics.

It is the principal object of this invention to provide a lateral transistor without an undesirable vertical current at the emitter.

It is a further object of this invention to provide a transistor having emitter and collector regions in a monolithic block in which the lateral current is dominant and therefore the device has superior gain and frequency characteristics.

Another object of the present invention is to provide a novel lateral transistor in a lightly doped layer.

For a description of the preferred embodiment of this invention, reference is made to the following description taken in conjunction with the accompanying drawing, in which.

Figure 1:
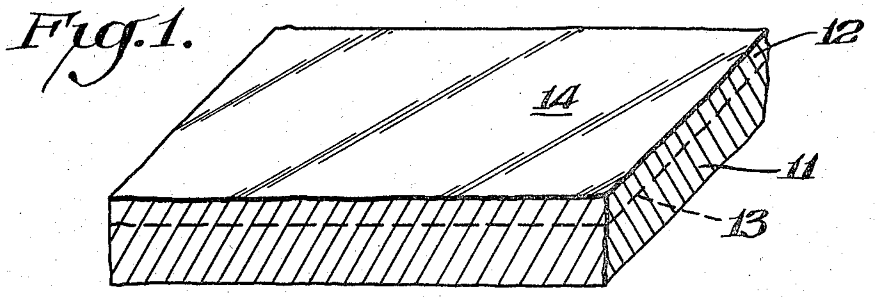
FIGURE 1 is a perspective view of a monolithic substrate during the fabrication steps of a preferred embodiment of the present invention.

The lateral transistor of the prior art contains a P-type emitter region centrally located in an N-type silicon body and surrounded by a concentric P-type collector region. The emitter region is terminated by a junction which is oriented principally in two directions. These directions are the lateral and planar directions, respectively. In the lateral direction the emitter lateral junction area is oriented normal to the major surface of the body. In the planar direction the stratum of the emitter planar junction area is generally oriented parallel to the major surface. Between the collector and the emitter the bulk silicon body acts as a base region. The transistor is prepared by suitable masking and diffusing techniques in which P-type carriers are diffused into the N-type silicon body to form a centrally located emitter region and an encircling collector region. That is, if the bulk is N-type silicon, the impurity must consist of acceptors which make the emitter and collector regions hole-conducting.

It is a feature of the present invention relating to the lateral structure that an improved lateral transistor is obtained which has performance characteristics comparable to a conventional transistor.

In general, this invention provides a lateral transistor in a monolithic body of semiconductive material of one conductivity-type. The emitter and collector regions of opposite conductivity-type extend from the surface into a low impurity concentration region toward a high impurity concentration region of the body. A vertical emitter current is prevented by the high concentration of opposite conductivity-type impurities underlying and in contiguity with the emitter planar junction area. The semiconductive impurity concentration in the high impurity concentration underlying layer is greater than the impurity concentration in the base region interposed between the two lateral junction areas.

Assuming the emitter is of P-type conductivity, the hole injection into the heavily doped underlying layer from the emitter planar junction area, which is in contiguity with the heavily doped underlying layer, is negligible. The ratio of hole-to-electron injection from the emitter planar junction area is over-balanced by the electron injection from the heavily doped region. At the emitter planar junction the electron injection predominates. Thus the ratio of injection is the reverse from that of the prior art lateral transistors in the comparable section of the emitter junction, and the electron current can be controlled by the doping levels so that it is not detrimental to the device characteristics.

The lightly doped base region into which the emitter and collector junctions are formed is of the same conductivity type as the heavily doped underlying layer. The major surface of the monolithic body is the surface of this lightly doped region. The emitter and collector junctions extend into this lightly doped region from the major surface, so that the lateral junction areas are separated by interposed lightly doped base regions.

The emitter lateral junction area exhibits an adequate hole injection into the lightly doped region to provide current flowing laterally from the emitter to the collector junction area. Good hole injection efficiency is provided in this lateral direction in the lightly doped region. These properties of the structure of this invention combine to result in a gain factor which is substantially different from that of the lateral transistors of the prior art by making the emitter current into the bulk region insignificant. Therefore the gain of the lateral transistors of this invention is considerably improved over the lateral transistor of the prior art.

Important features of this invention are the engagement of the emitter and collector junctions with the heavily doped underlying region. The arrangement of the relative impurity concentrations among the underlying layer, the emitter region, and the interposed lightly doped base region provide the underlying layer with a greater impurity concentration than that of the emitter region, and provide the emitter region with an impurity concentration greater than that of the base.

For the purpose of illustration, the following description of the invention refers to a device having a P-type emitter and an N-type high impurity concentration underlying layer. If the device is to be made by diffusion, the dopant impurities must be chosen so that the diffusion coefficient of the N-type impurity in the underlying bulk region is less than the diffusion coefficient of the P-type impurity forming the emitter. Therefore a good junction will be formed where the P-type emitter meets the n++ layer, and as a result the vertical hole injection will be eliminated.

Briefly, the process consists of first producing by known prior art techniques a homogeneous highly doped substrate, for example an N-type silicon wafer. Next there is produced a very thin and lightly doped N-type silicon layer over or in the heavily doped substrate, for example, a layer 2 microns thick may be epitaxially grown by known prior art techniques on the heavily doped substrate. By suitable masking and diffusing techniques a P-type impurity, such as boron, is selectively diffused into the epitaxial lightly doped layer to form the emitter and collector regions in a spaced-apart pattern. The indiffusion is carried on to extend the P-type impurity across the lightly doped layer to the heavily doped underlying layer. There results a plurality of P-type regions in the epitaxial lightly doped layer separated by interposed lightly doped N-type conductivity regions. The P-type regions are the emitter and collector regions of the transistor of this invention, and the interposed lightly doped N-type region is the base.

In the product device the collector and emitter P-type regions with the interposed base N-type region are in contiguity with the underlying heavily doped N-type region at the planar junction areas. The emitter to collector current flows almost exclusively laterally from the emitter lateral junction area to the collector lateral junction area.

The emitter and collector contacts are provided, as by suitable metallizations, and electrical connections attached to these contacts. The base contact is made to the n++ layer (substrate).

Referring to the preferred embodiment illustrated in the drawing, FIGURE 1 shows a heavily doped N-type substrate 11 having a layer 12 of N-type monocrystalline semiconductor material epitaxially grown over the region 11. The layer 12 is provided with a homogeneous distribution of N-type impurities in a relatively low concentration in relation to the relatively high concentration in the underlying region 11. The region 11 and layer 12 form a monocrystalline structure of the same conductivity type, but with a relative impurity distribution which provides a L-H junction 13.

Figure 2:
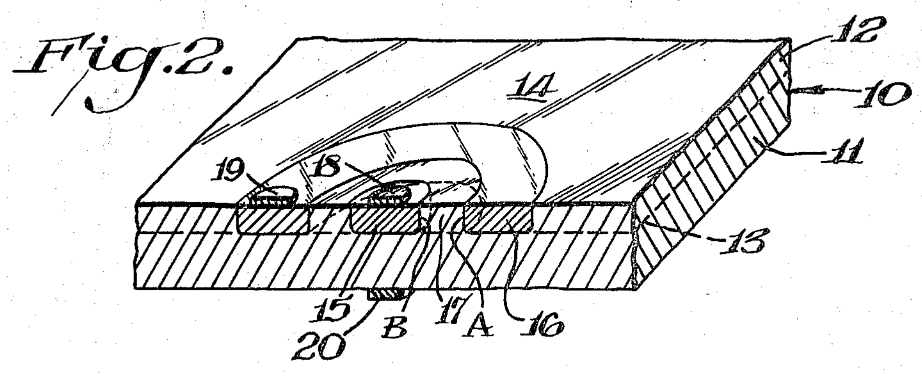
FIGURE 2 is a perspective view partly in section of the device of this invention formed in the monolithic substrate of FIGURE 1.

Next a suitable technique, such as a photoresist procedure, provides a pattern over a major surface 14 of the layer 12 through which P-type carriers are diffused through the lightly doped N-type layer 12. As shown in FIGURE 2 an emitter region 15 and a collector region 16 are formed. As illustrated in the described embodiment, the emitter region 15 is centrally located, with the collector region 16 concentrically formed at a close distance from the emitter region 15. The N-type spacing between the regions 15 and 16 serves as the base 17. The diffusion is carried on sufficiently to effect a diffusion of P-type material downwardly through the lightly doped layer 12, so that the planar junction areas of the emitter and collector regions are at least contiguous to the heavily doped underlying region 11. It is important that the planar junction areas of the emitter and collector are in a region of the base that is considerably more heavily doped than the base region between the lateral junction areas of the emitter and collector.

As shown in FIGURE 2 the collector 16 presents a collector lateral junction area A which faces the emitter lateral junction area B across the interposed lightly doped base region 17. Hence, current flowing between these areas A and B is lateral to the respective regions 16 and 15.

Next metallizations 18, 19 and 20 are formed into ohmic contacts on the emitter 15, collector 16, and base region 11, respectively. It will be seen that suitable connections can be electrically attached to the metallizations 18, 19 and 20 and the product transistor connected to suitable circuitry to apply an input voltage producing currents with a constant available output.

Figure 3:
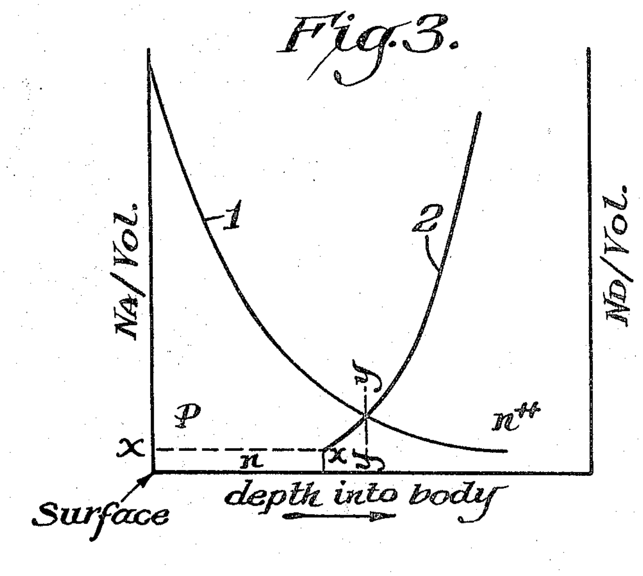
FIGURE 3 shows a graph plotting the profiles of the impurity concentrations as a function of depth in the semiconductive body to illustrate the related impurity concentrations according to this invention.

FIGURE 3 is a graph of the diffusion profile of the acceptor and donor impurity concentrations per unit volume as a function of depth in the lateral transistor of this invention. This diffusion profile shows a typical impurity distribution for the structure in which the curves representing the acceptor impurity concentration and the donor impurity concentration show the relationship of concentration to depth. The acceptor impurity concentration of the emitter as a function of depth is represented by the curve 1. The donor impurity concentration of the heavily doped region is represented by curve 2. The donor impurity concentration of the lightly doped region is indicated as that below the broken line X—X. The profile indicated by curve 2 illustrates the abrupt change in concentration by depth of the n++ bulk, and indicates that the heavily doped region 11 is more semiconducting than the lightly doped layer 12 with its relatively low concentration of N-type impurities.

It is a feature of this invention that the diffusion producing the emitter introduces the acceptor impurities physically into the semiconductive body to an area where the P-N junction has reached a point where the hole injection into the bulk is negligible. In this device the emitter junction area meets the heavily doped inner region as illustrated by FIGURE 3. The diffused emitter impurity extends to, but does not substantially penetrate, the heavily doped region, and thus a sharp junction is provided where the emitter planar junction area engages the heavily doped inner region. This is illustrated by the meeting of curves 1 and 2 in FIGURE 3. It is seen that the concentration curves meet at an impurity concentration of the low concentration region, and in a portion of the curve 2 which is relatively steep as indicated at the broken line Y—Y.

In order to aid in understanding and practicing the invention, the following example is presented, it being understood that these specifications should not be construed as limitations.

*Example*

A PNP structure as shown in FIGURE 2 was formed using a silicon wafer having an N-type impurity concentration of about $10^{20}$ cm.$^{-3}$. A thin silicon layer having an N-type impurity concentration of about $10^{16}$ cm.$^{-3}$ was epitaxially grown on the surface to a thickness of a few microns. A silicon oxide coat was formed on the wafer and layer by heating in an oxidizing atmosphere, as for example at 1250°, for sufficient time to form a mask against impurities. After oxidation, the emitter and collector windows were etched by a photoresist process. The windows were shaped as indicated in FIGURE 2. The masked body was exposed to diffusion in a $B_2H_6+O_2+N_2$ atmosphere for sufficient time to indiffuse the P-type impurity until it extended through the layer to the wafer to produce a PNP transistor with the geometry shown in FIGURE 2 providing an emitter diameter of 0.5 mil and a depth penetration of 0.1 mil.

The improved structure of this invention provides doping ratios that may be adjusted so that the vertical hole current is eliminated. This is advantageous for good device characteristics. Other advantages of the transistor of this invention include the built-in electrical field at the L-H junction which is directed such that it aids in constraining the laterally injected holes to the base region.

Previously the PNP lateral transistor of the prior art was used in conjunction with a conventional NPN transistor. Among other advantages, the PNP lateral transistor of this invention exhibits adequate gain to function individually as a conventional transistor. The structure of this invention provides a high performance PNP transistor in silicon, using minimum of masking steps, and the process is compatible with present monolithic processes.

Although the above description refers specifically to a PNP-type transistor, it will be appreciated that it is equally applicable to NPN-type transistors. While the above description contains illustrations of the invention, it will be understood that modifications of the embodiment as set forth are possible and it will be understood that the scope is intended to be limited only by the appended claims.

What is claimed is:

1. An improved lateral transistor comprising a semiconductor body having a high impurity concentration region of a first conductivity type, a homogeneous lower impurity concentration layer of said first conductivity type adjoining the high impurity concentration region, at least one emitter region and one collector region of equal impurity concentration of the opposite conductivity type extending from the top surface of said lower impurity concentration layer and forming sharp P-N junctions with the high impurity concentration region, the impurity concentration in the high concentration region being greater than the impurity concentration of the predominating impurities in the emitter, and the impurity concentration in the emitter being greater than the impurity concentration in said homogeneous lower impurity concentration layer, whereby vertical emitter current into said high impurity concentration region is negligible in comparison to lateral emitter current into said homogeneous lower impurity concentration layer.

2. The improved lateral transistor as claimed in claim 1 in which said semiconductor body is silicon having an N-type impurity concentration of about $10^{20}$ per cubic centimeter.

3. The improved lateral transistor as claimed in claim 1 in which said lower impurity concentration layer is very thin having an N-type impurity concentration of about $10^{16}$ per cubic centimeter.

4. The improved lateral transistor as claimed in claim 1 in which the N-type dopant impurity in the high impurity concentration body region has a smaller diffusion coefficient than the P-type dopant impurity in said emitter region so that said sharp P-N junction formed at the engagement of the emitter with said high impurity concentration region prohibits vertical hole injection from the emitter into the body.

References Cited

UNITED STATES PATENTS 3,244,950 4/1966 Ferguson ----------- 317—235
3,246,214 4/1966 Hugle -------------- 317—235

JOHN W. HUCKERT, *Primary Examiner.*
JERRY D. CRAIG, *Assistant Examiner.*

U.S. Cl. X.R.

148—175, 187